(12) United States Patent
Clevenger et al.

(10) Patent No.: US 7,329,600 B2
(45) Date of Patent: Feb. 12, 2008

(54) LOW DIELECTRIC SEMICONDUCTOR DEVICE AND PROCESS FOR FABRICATING THE SAME

(75) Inventors: Lawrence Clevenger, Lagrangeville, NY (US); Louis Hsu, Fishkill, NY (US); Christy S. Tyberg, Mahopac, NY (US); Tsorng-Dih Yuan, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 269 days.

(21) Appl. No.: 10/817,179

(22) Filed: Apr. 2, 2004

(65) Prior Publication Data

US 2005/0227480 A1 Oct. 13, 2005

(51) Int. Cl.
*H01L 21/4763* (2006.01)
(52) U.S. Cl. ..................................... 438/637
(58) Field of Classification Search ........... 438/637
See application file for complete search history.

(56) References Cited

U.S. PATENT DOCUMENTS

| | | | | |
|---|---|---|---|---|
| 5,821,168 | A * | 10/1998 | Jain | 438/692 |
| 6,207,553 | B1 * | 3/2001 | Buynoski et al. | 438/622 |
| 6,670,237 | B1 * | 12/2003 | Loh et al. | 438/253 |
| 6,815,329 | B2 * | 11/2004 | Babich et al. | 438/619 |
| 6,815,346 | B2 * | 11/2004 | Davis et al. | 438/666 |

OTHER PUBLICATIONS

E. Delamarche et al., "Litography Beyond Light: Microcontact Printing with Monolayer Resists," IBM J. Res. Develop. 41, pp. 159-170 (1997).
E. Delamarche et al., "Stability of Molded Polydimethylsiloxane Microstructures," Adv. Mater. 9, pp. 741-746 (1997).
E. Delamarche et al. . , "Transport Mechanisms of Alkanethiols during Microcontact Printing on Gold," Journal of Phys. Chem., vol. 102, pp. 3324-3334. (1998).
L. Libioulle et al., "Contact-Inking Stamps for Microcontact Printing of Alkanethiols on Gold," Langmuir vol. 15, pp. 300-304 (1999).
H. Schmid et al., "Light-Coupling Masks for Lensless, Sub-Wavelength Optical Lithography," Appl. Phys. Lett. vol. 72, pp. 2379-2381 (1998).

* cited by examiner

*Primary Examiner*—Thao P. Le
(74) *Attorney, Agent, or Firm*—Ohlandt, Greeley, Ruggiero & Perle, L.L.P.; Robert M. Trepp, Esq.

(57) ABSTRACT

A process for fabricating a low dielectric constant semiconductor comprising the steps of: depositing a first metal layer on a substrate; patterning the first metal layer to produce a patterned first metal wiring; applying a first insulating material onto the patterned first metal wiring to form a support structure; patterning the first insulating material by a contact printing process; depositing a second insulating material of lower dielectric constant onto the support structure; planarizing the second insulating material; depositing a polish-stop film layer over the planarized second insulating material, thereby forming a plurality of metal studs; depositing a second metal layer onto the polish-stop film layer forming interconnects with said studs; and patterning the metal layer to produce a second metal wiring interconnecting to the first wiring via the metal studs.

23 Claims, 3 Drawing Sheets

■ 0.1 mm

LOW DIELECTRIC SEMICONDUCTOR DEVICE AND PROCESS FOR FABRICATING THE SAME

BACKGROUND OF THE INVENTION

1. Field of the Invention

This invention pertains to the field of microelectronic chip fabrication for logic, memory, communication and microcontroller applications. More particularly, this application pertains to the use of a support structures to enable the integration of ultra low dielectric constant (K) materials in semiconductor devices.

2. Description of the Prior Art

The operating speeds of silicon integrated circuits are increasing at phenomenal rates to meet aggressive performance demands in computing, communication and microcontroller applications. This in turn necessitates that signal propagation delays in the wiring that is used to interconnect the circuits on a chip be reduced so that performance is not unduly limited or hampered by interconnect delays. Interconnect delays in chips occur due to the RC time constants wherein R is the resistance of the on chip wiring and C is the effective capacitance between the signal lines and the surrounding conductors in the multilayer interconnection stack.

Interconnect capacitance can be reduced by reducing the dielectric constant, K, of the insulating medium that surrounds these lines. Hence, there has been a significant effort to identify and use low K insulators in interconnect structures. A whole gamut of insulator materials including fluorinated silica, polymers with and without fluorination, amorphous teflon-like polymers, and aerogels made of porous silica have been proposed as possible low K materials for this purpose.

There are several practical difficulties in integrating the low K dielectric materials in such a wiring structure. First, the physico-chemical properties of many of these low K materials are not optimal for the chemical-mechanical polishing process. For example, most of the polymer materials are too soft and erode at too a rapid rate during chemical-mechanical polishing to allow good control over the inlaid layer thickness. Some of these issues can be contained by applying a hard cap layer over the dielectric to act as a chemical-mechanical polishing stop layer, however this requires additional processing and the difficulty of ensuring compatibility of the low K material with the processing of this additional layer. Second, most of the low K polymers degrade under thermal excursions to temperature at or above 400° C. Hence, they are not suitable for the device interconnection application because they cannot withstand device damage inflicted during an annealing process severely restricting the choice of dielectric that can be used for this purpose. Last, porous inorganic dielectrics such as aerogels are mechanically weak (i.e. porous and brittle) and, therefore, unlikely to withstand a multilayer build process of repeated metal deposition and chemical-mechanical polishing.

A method taught by Chang et al., U.S. Pat. No. 5,559,005, solves this problem with a process in which a first layer is fabricated of aluminum-based interconnect wiring, comprising an insulator (silicon dioxide) and a stud layer deposited into the vias in the insulator. A second interconnect wiring layer of aluminum alloy is then deposited and patterned on top of the first layer. The insulator is removed from between the metal features by an etching process. The structure is then either fully or partially filled with a lower dielectric constant material, and a passivation layer is deposited over the resulting structure. A net lowering of the dielectric constant is achieved by this process due to the replacement of the oxide material with a lower K insulator. While this method, in principle, can achieve a uniform and lower K value dielectric, the partially voided low K dielectric structure does not yield a uniform or predictable value of effective K due to the fact that the presence or absence of voiding depends on a myriad of factors including the size, spacing and aspect ratio of the metal features and, for solution-based insulator depositing, the viscosity and the solvent content of the filling insulator precursor solution. This complicates the task of designing circuits since circuits require that the effective dielectric constants be precisely known and maintained within a narrow range to achieve minimized delay tolerances and hence improved chip performance.

A method taught by Buchwalter et al., U.S. Pat. No. 6,148,121 describes a process in which air, having the lowest dielectric constant, is used as the intralevel dielectric. A multilayer interconnect wiring structure is fabricated by methods and materials currently known in the state of the art of semiconductor processing; the intralevel dielectric between adjacent metal features is then removed by a suitable etching process; the etched structure is annealed to remove plasma damage; a thin passivation coating is applied over the exposed etched structure; an insulating cover layer is laminated to the top surface of the passivated metal features; an insulating environmental barrier layer is optionally deposited on top of the cover layer; and vias are etched in the environmental barrier layer, cover layer and the thin passivation layer for terminal pad contacts. The device is completed by fabricating terminal input/output pads. While this method obviates issues such as processablity and thermal stability associated with low dielectric constant materials by avoiding their use, the method requires additional processing steps.

The process of the present invention accomplishes the above-mentioned goals in an efficient and cost-effective process that obviates the additional processing steps of patterning, etching and alignment. The instant invention, by adapting contact printing, rather than convention lithography, to form a support structure provides a more practical and economical solution for the integration of ultra low K dielectrics. The use of contact printing, a high-through-put high-resolution printing technique as an alternative to lithography provides several benefits not provided by conventional chip fabrication methods. First, contact printing addresses issues in the science of manufacturing at scales below 200 nm. Second, contact printing enables completely novel approaches to semiconductor chip fabrication. Pattern transfer is direct, thereby enabling novel strategies of assembling semiconductor devices. A further benefit provided by the contact printing process in the manufacture of semiconductor devices is that the alignment of the support structure is not critical to the contact printing process.

SUMMARY OF THE INVENTION

Use of porous ultra low dielectric constant materials in high performance microelectronic device chips, while desirable, is problematic due to their porosity and poor mechanical stability. Porous ultra low dielectric constant materials cannot survive standard wafer processing without failure or delimitation of the high modulus dielectric material.

Accordingly, it is an object of the present invention to provide a method for achieving a low K chip interconnect structure that circumvents the problems and limitations described above.

It is also an object of the present invention to fabricate interconnect structures with the readily available set of semiconductor processing tools and materials.

It is another object of this invention to provide a practical, low cost and high resolution solution for the integration of ultra low K dielectric materials by adapting a contact printing technique, which does not require the conventional fabrication steps of patterning, etching or alignment, addresses issues in the science of manufacturing at scales below 200 nm, and allows new approaches to fabrication of assembling devices.

It is yet another object of the present invention to provide a support structure for porous ultra low dielectric constant materials formed of an insulating material that enables the porous ultra low dielectric constant material to sustain mechanical stress during chemical-mechanical polishing processing.

It is a further object of the present invention to provide a process in which the area ratio of support structure to porous low dielectric constant material is very low, such that the overall dialectic constant of the combination remains close to that of the porous low dielectric constant material.

BRIEF DESCRIPTION OF THE DRAWINGS

Further objects, features, and advantages of the present invention will become apparent from a consideration of the following detailed description of the invention when read in conjunction with the drawing FIGURES, in which.

DETAILED DESCRIPTION OF THE INVENTION

Figure 1:
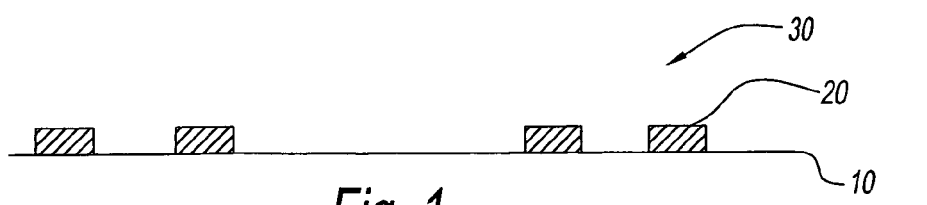
FIG. 1 illustrates the step of depositing and patterning a metal coated substrate layer to form the low K dielectric semiconductor device of the present invention.

The present invention discloses a process for fabricating a multilayer low dielectric K semiconductor device that possesses a very low capacitance and, hence, fast propagation speeds. The semiconductor of the present invention successfully integrates a porous, and therefore brittle, ultra low K dielectric insulating material (or materials) by employing a non-porous low K dielectric insulating material support structure. The support structure acts as a support, which enables the ultra low K dielectric to sustain mechanical stresses applied during the chemical-mechanical polishing steps. The semiconductor device is formed by the following sequence:

A first metal layer 20 is deposited on a substrate 10, as illustrated in FIG. 1. First metal layer 20 may be formed of aluminum, copper or similar material. First metal layer 20 is patterned to produce a patterned first metal wiring 30. Patterning of first metal layer 20 is accomplished by conventional methods known in the art such as reactive ion etching (RIE) or damascene processing.

Figure 2:
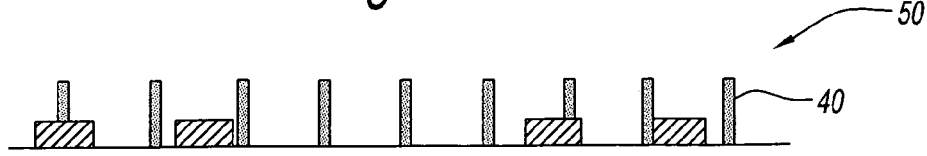
FIG. 2 illustrates step of forming a print support structure using a high through-put printing technique to form the low K dielectric semiconductor device of the present invention.
Figure 8A:
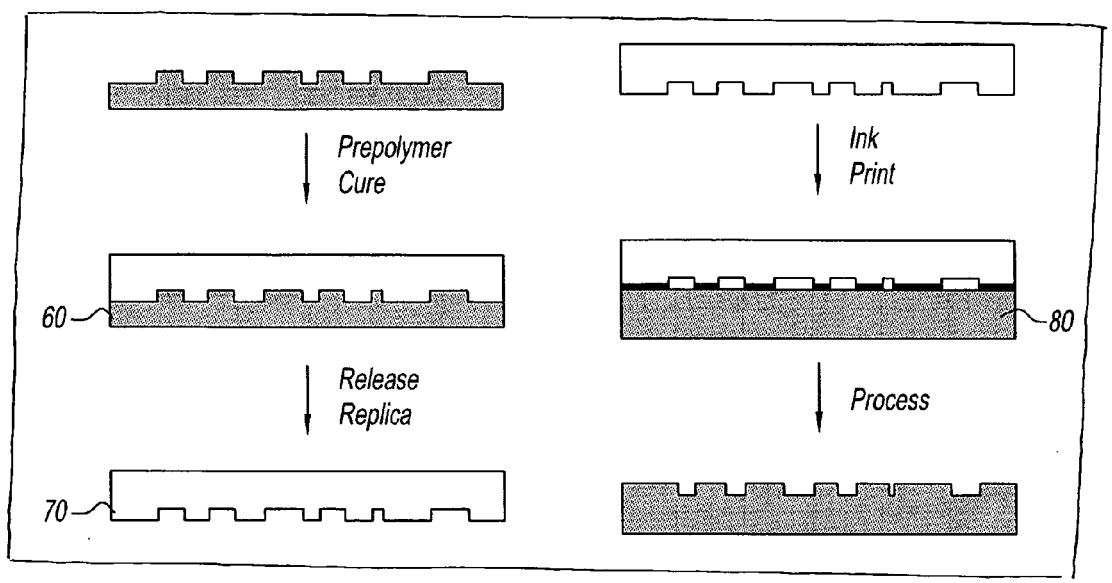
FIG. 8a illustrates the contact printing process for forming the support structure of the low K dielectric semiconductor device of the present invention.
Figure 8B:
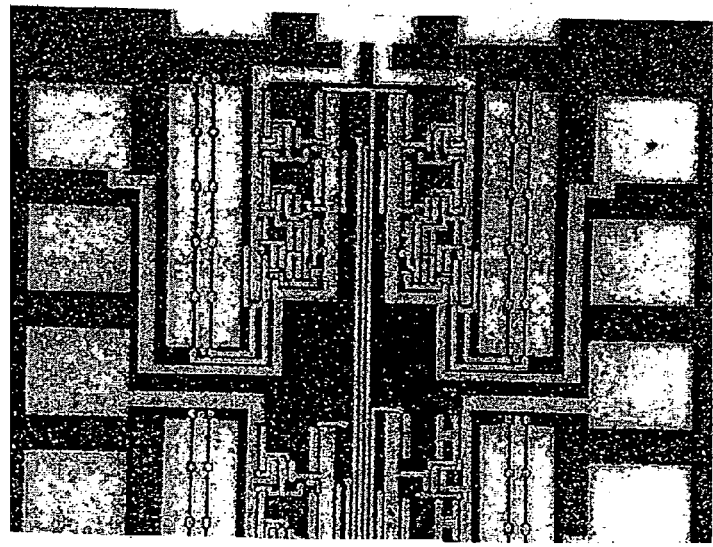
FIG. 8b illustrates the support structure of the low K dielectric semiconductor device of the present invention
Figure 9:
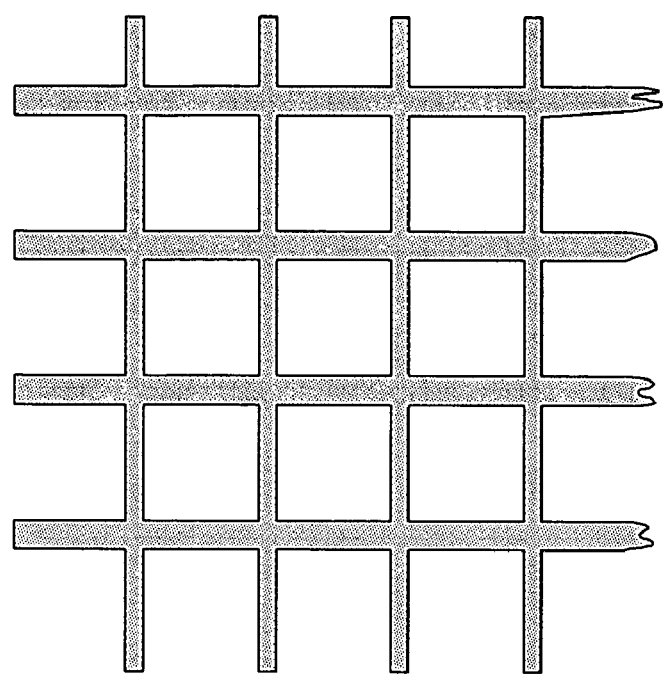
FIG. 9 illustrates a first non-limiting pattern for the support structure of the low K dielectric semiconductor device of the present invention.
Figure 10:
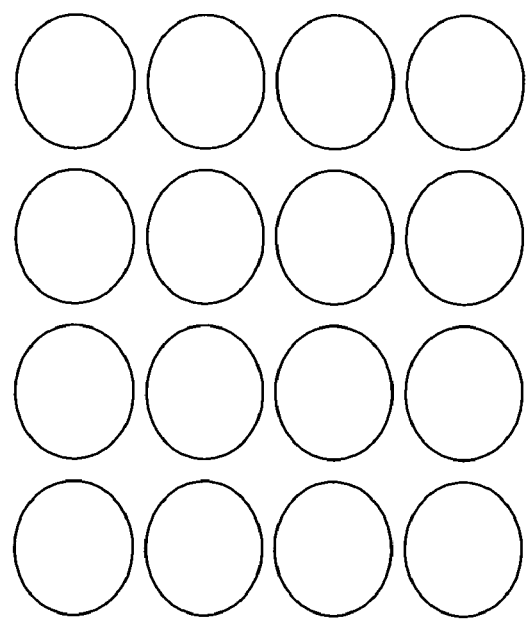
FIG. 10 illustrates a second non-limiting pattern for the support structure of the low K dielectric semiconductor device of the present invention.

A support structure 50 for an ultra low K dielectric material is formed by applying a first insulating material 40 to patterned first metal wiring 30, as illustrated in FIG. 2. First insulating material 40 is a non-porous low K dielectric. Support structure 50 is formed on patterned first metal wiring 30 and is patterned using contact printing, as illustrated in FIG. 8a. FIG. 8b illustrates a finished support structure, patterned with the process illustrated in 8a. A contact printed stamp 60 is fabricated by casting polydimethylsiloxane (PMDS) on a master 70 with a negative of the desired pattern. The negative is produced using e-beam or STM lithography. Support structure 50 is cured and PDMS stamp 60 is peeled away from master 70. Master 70 is then exposed to ink transferred by transient contact between stamp 60 and substrate 80. FIGS. 8a, and 8b illustrate non-limiting alternative support structure patterns for plating.

First insulating material 40 preferably has a dielectric K lower than 3.9. First insulating material 40 may be any conventional polymer or insulator having a proper physical strength. Non-limiting examples of suitable organic polymeric materials include aromatic thermosetting polymeric resins, such as resins manufactured by Dow Chemicals, Co. under the trade name SiLK, and polymeric resins sold by Honeywell Microelectronics under the trade name Flare. Additionally, nonporous inorganic or organic-inorganic hybrid materials such as methylsilsesquioxane (MSQ), hydridosilsesquioxane (HSQ), MSQ-HSQ copolymers, MSQ-HSQ blends, tetraethylorthosilane, or any other low K inorganic materials capable of withstanding high forces during CMP can be used. Organic aromatic thermosetting polymers are preferred due to their increased strength, as compared with inorganic dielectrics.

Contact printing provides many benefits over conventional lithography. Contact printing does not require patterning or etching as is required by conventional lithography. Contact printing allows manufacturing at scales below 200 nm. Contact printing also allows for novel approaches to semiconductor fabrication because the pattern transfer is direct, it does not have diffraction limitations, it is inherently parallel, and it uses conformal contact to affect material properties of the substrate.

Figure 3:
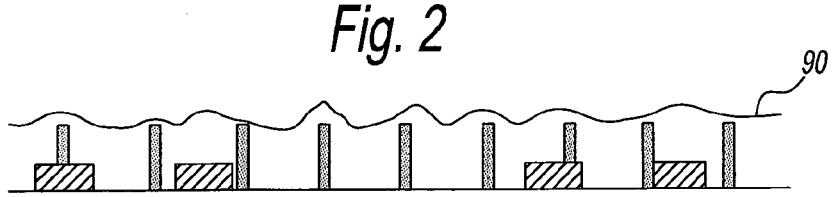
FIG. 3 illustrates the step of depositing a porous ultra low dielectric constant material to form the low K dielectric semiconductor device of the present invention.

Second insulating material 90 is deposited onto support structure 50, as illustrated in FIG. 3. Second insulating material 90 is a porous ultra low K dielectric material having a lower dielectric K than the dielectric K of first insulating material 40 of the support structure 50. Examples of ultra low dielectric K materials suitable for second insulating material 90 are any organic or inorganic dielectric material with a dielectric K less than 2.2. Preferably, second insulating material 90 has a dielectric K less than 1.8. Porous inorganic materials or inorganic-organic hybrids such as porous Methylsilsesquioxane (MSQ), porous hydridosilsesquioxane (HSQ), porous MSQ-HSQ copolymers, porous MSQ-HSQ blends, porous tetraethylorthosilane, or any other porous low K inorganic materials may also be used. Suitable porous organic materials may include any aromatic thermosetting polymeric resin, for example resins sold by Dow Chemicals Co. under the trade name SiLK, a polymeric resin sold by Honeywell microelectronics under the trade name Flare, and similar resins from other suppliers.

Alternatively, the porous ultra low dielectric constant material used for second insulating material 90 may be applied as a non-porous material containing a sacrificial spacer. The sacrificial spacer is subsequently removed by thermal treatment or other processing known in the art.

Figure 4:
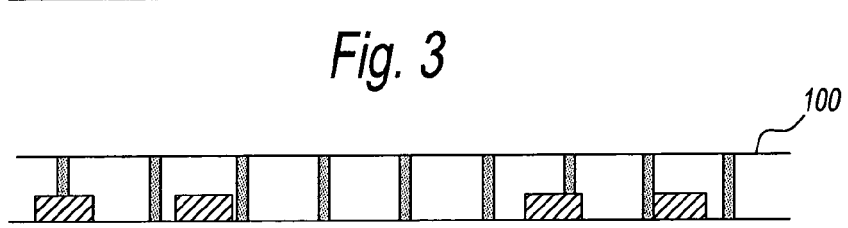
FIG. 4 illustrates the step of planarizing the porous ultra low dielectric constant material to form the low K dielectric semiconductor device of the present invention.

Second insulating material 90 is then planarized, as illustrated in FIG. 4. Planarization is accomplished by etch back or chemical-mechanical polishing processing. Preferably, etch-back processing is employed to planarize the surface 100 of second insulating material 90 prior to depositing the chemical-mechanical polishing stop layer. Etch back of the planar surface can be achieved by first spin coating a material that is similar to the dielectric material used, has the same etch rate as the dielectric material, and is capable of forming a planar surface. A non-limiting example is application, by spin coating, of a thin polyamide layer. The coating can then be etched using a timed etch process to planarize the surface of the dielectric material.

Figure 5:
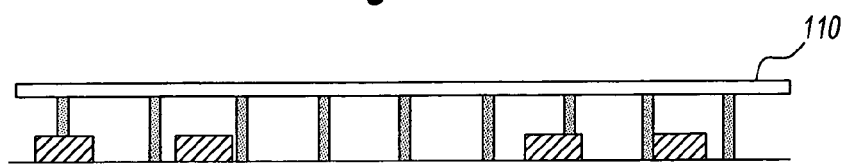
FIG. 5 illustrates the step of polish-stop film deposition to form the low K dielectric semiconductor device of the present invention.

A chemical-mechanical polish-stop film layer 110 is then deposited on said planarized low dielectric K surface 100, as illustrated in FIG. 5. Chemical-mechanical polish-stop film layer 110 reduces the roughness of surface 100 by removing excess material from the surface.

Figure 6:
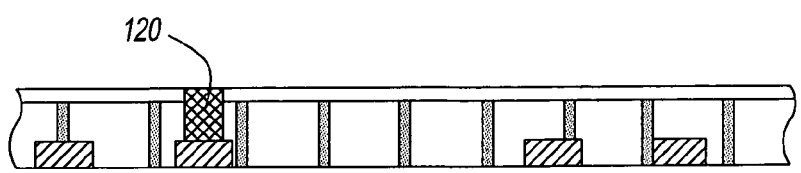
FIG. 6 illustrates the step of forming a metal stud layer to form the low K dielectric semiconductor device of the present invention.

A plurality of interconnect metal studs 120 are then formed on first metal layer 20, as illustrated in FIG. 6, using a damascene process. Interconnect metal studs 120 are delineated, thereby isolating them by means of chemical-mechanical planarization. An interconnect pattern is lithographically defined in the second insulating dielectric material, thereby producing trenches. Metal is deposited to fill the resulting trenches. Excess metal is removed by means of chemical-mechanical planarization.

Figure 7:
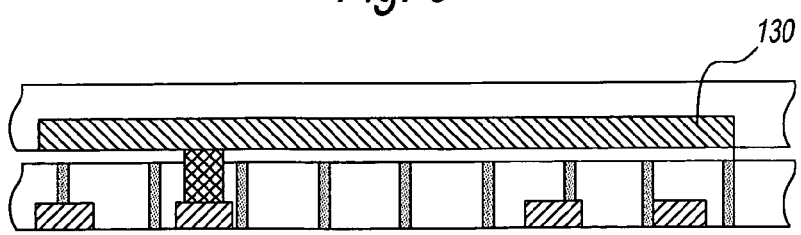
FIG. 7 illustrates the step of producing metal interconnects to form the low K dielectric semiconductor device of the present invention.

A second metal layer 130 is then deposited onto said polish-stop film layer 110 to produce interconnects with metal studs 120, as illustrated in FIG. 7. Second metal layer 130 is patterned to produce interconnects to first metal layer 20.

The entire process may be optionally repeated to create a layered semiconductor device with vertical pathways.

Since the area ratio of support structure to the porous dielectric is low, the overall dielectric K of the combination remains close to that of the porous low dielectric K material. The resulting dielectric K of the semiconductor device after the addition of the low-K porous and the support materials is $K1*r+K2*(1-r)$, where K1 and K2 are the dielectric K of the low-K porous and the support materials, respectively and r is the ratio of the support area to the total area. If $K2<<K1$ and $r<<1$, then the effective dielectric K of the insulating film remains very low and the structure will be strong enough to support subsequent fabrication processes.

The present invention has been described with particular reference to the preferred embodiments. It should be understood that the foregoing descriptions and examples are only illustrative of the invention. Various alternatives and modifications thereof can be devised by those skilled in the art without departing from the spirit and scope of the present invention. Accordingly, the present invention is intended to embrace all such alternatives, modifications, and variations that fall within the scope of the appended claims.

What is claimed is:

1. A process for fabricating a low dielectric constant semiconductor comprising the steps of:
    depositing a first metal layer on a substrate;
    patterning said first metal layer to form a patterned first metal wiring;
    forming a support structure on said patterned first metal wiring using a stamp contact printing technique, wherein said support structure is a first insulating material having a dielectric constant $K_1$;
    depositing a second insulating material onto said support structure, wherein said second insulating material has a dielectric constant $K_2$;
    planarizing said second insulating material to a surface of said support structure;
    depositing a polish-stop film layer over said planarized second insulating material and said support structure;
    forming a plurality of metal studs in said planarized second insulating material and said support structure under said polish-stop film layer;
    depositing a second metal layer onto said polish-stop film layer; and
    patterning said second metal layer to form second mental wiring interconnected to said first metal wiring via said metal studs.

2. The process of claim 1, further comprising repeating each of said steps.

3. The process of claim 1, wherein said dielectric constant $K_2$ of said second insulating material is lower than said dielectric constant $K_1$ of said first insulating material.

4. The process according to claim 1, wherein said first metal layer is patterned by a process selected from the group comprising reactive ion etching or damascene.

5. The process of claim 1, wherein said contact printing comprises the steps of:
    forming a stamp,
    forming a master connected to said stamp, wherein said master has a negative of a desired printing pattern,
    curing said master and said stamp,
    peeling said stamp away from said master, and
    exposing said master to ink.

6. The process according to claim 1, wherein said step of depositing said second insulating material further comprising the steps of:
    applying a non-porous material having a spacer; and
    removing said spacer.

7. The process according to claim 6, wherein said removing step is carried out by heating.

8. The process of claim 1, wherein said planarizing step is carried out by a method selected from the group comprising etch back processing, chemical-mechanical polishing processing or any combinations thereof.

9. The process according to claim 8, wherein said etch back process comprises the steps of:
    spin coating a material having the same etch rate as said second insulating material; and
    etching said spin coated material to produce a planar surface on said second insulating material.

10. The process of claim 1, wherein said metal studs are formed by damascene process.

11. The process of claim 1, wherein said first insulating material is a low K dielectric having a dielectric constant less than 4.

12. The process of claim 1, wherein said first insulating material is a low K dielectric having a dielectric constant less than 3.

13. The process according to claim 1, wherein said first insulating material is selected from the group comprising polymers, organic polymeric materials, inorganic polymeric materials, polymeric resins, nonporous inorganic materials, organic-inorganic hybrid materials, low dielectric constant inorganic material, low dielectric constant inorganic materials, or combinations thereof.

14. The process of claim 1, wherein said second insulating material is a low K dielectric with a dielectric constant less than 2.

15. The process of claim 1, wherein said second insulating material is a low K dielectric with a dielectric constant less than 1.8.

16. The process according to claim 1, wherein said second insulating material is a porous inorganic-organic hybrid.

17. The process according to claim 16, wherein said porous inorganic-organic hybrid is selected from the group comprising methylsilsesquioxane, porous hydridosilsesquioxane, porous methylsilsesquioxane-hydridosilsesquioxane copolymer, porous methylsilsesquioxane-hydridosilsesquioxane blends, porous tetraethylorthosilane, or any combinations thereof.

18. The process according to claim 1, wherein said second insulating material is a porous organic material.

19. The process according to claim 18, wherein said porous organic material is an aromatic thermosetting polymeric resin.

20. The process according to claim 1, wherein said first insulating material is non-porous.

21. The process according to claim 1, wherein said second insulating material is porous.

22. A low dielectric constant device prepared by a process comprising the steps of:
   depositing a first metal layer on a substrate;
   patterning said first metal layer to form a patterned first metal wiring;
   forming a support structure on said patterned first metal wiring using a stamp contract printing technique, wherein said support structure is a first insulating material having a dielectric constant $K_1$;
   depositing a second insulating material onto said support structure, wherein said second insulating material has a dielectric constant $K_2$;
   planarizing said second insulating material to a surface of said support structure;
   depositing a polish-stop film layer over said planarized second insulating material and said support structure;
   forming a plurality of metal studs in said planarized second insulating material and said support structure under said polish-stop film layer;
   depositing a second metal layer onto said polish-stop film layer; and
   patterning said second metal layer to form second metal wiring interconnected to said first metal wiring via said metal studs.

23. A process for fabricating a low dielectric constant semiconductor comprising the steps of:
   depositing a first metal layer on a substrate;
   patterning said first metal layer to produce a patterned first metal wiring;
   forming a support structure on said patterned first metal wiring using a stamp contact printing technique, wherein said support structure is a first insulating material having a dielectric constant $K_1$;
   depositing a second insulating material onto said support structure, wherein said second insulating material has a dielectric constant $K_2$ that is lower than said dielectric constant $K_1$ of said first insulating material;
   planarizing said second insulating material to a surface of said support structure;
   depositing a polish-stop film layer over said planarized second insulating material and said support structure;
   forming a plurality of metal studs in said planarized second insulating material and said support structure under said polish-stop film layer;
   depositing a second metal layer onto said polish-stop film layer; and
   patterning said second metal layer to interconnect second metal wiring with first wiring via said metal studs.

* * * * *